US012777892B2

(12) United States Patent
Shikata et al.

(10) Patent No.: US 12,777,892 B2
(45) Date of Patent: Oct. 27, 2026

(54) ELECTROSTATIC CHUCK

(71) Applicant: Tomoegawa Corporation, Tokyo (JP)

(72) Inventors: Ryouji Shikata, Shizuoka (JP); Yuki Shimizu, Shizuoka (JP); Tomoya Hagihara, Shizuoka (JP); Junya Arashima, Shizuoka (JP)

(73) Assignee: TOMOEGAWA CORPORATION, Tokyo (JP)

( * ) Notice: Subject to any disclaimer, the term of this patent is extended or adjusted under 35 U.S.C. 154(b) by 161 days.

(21) Appl. No.: 18/848,715

(22) PCT Filed: Mar. 31, 2023

(86) PCT No.: PCT/JP2023/013583
§ 371 (c)(1),
(2) Date: Sep. 19, 2024

(87) PCT Pub. No.: WO2023/191065
PCT Pub. Date: Oct. 5, 2023

(65) Prior Publication Data

US 2025/0226256 A1 Jul. 10, 2025

(30) Foreign Application Priority Data

Mar. 31, 2022 (JP) ................................ 2022-058351
Mar. 31, 2022 (JP) ................................ 2022-058354

(51) Int. Cl.
*H10P 72/72* (2026.01)
*H01J 37/32* (2006.01)

(52) U.S. Cl.
CPC ...... *H10P 72/722* (2026.01); *H01J 37/32715* (2013.01); *H01J 2237/2007* (2013.01)

(58) Field of Classification Search
CPC .... H10P 72/722; H10P 72/70; H10P 72/7616; H01J 37/32715; H01J 2237/2007; H02N 13/00
See application file for complete search history.

(56) References Cited

U.S. PATENT DOCUMENTS 6,166,897 A * 12/2000 Matsunaga ........... H02N 13/00 361/234
6,256,187 B1 * 7/2001 Matsunaga ............. B23Q 3/00 429/208

(Continued)

FOREIGN PATENT DOCUMENTS

JP H02304946 A 12/1990
JP 2003060020 A 2/2003

(Continued)

OTHER PUBLICATIONS

Taiwan Patent Office, Office Action issued in TW 112112591 dated Nov. 12, 2024.

(Continued)

*Primary Examiner* — Thienvu V Tran
*Assistant Examiner* — Muaamar Qahtan Al-Taweel
(74) *Attorney, Agent, or Firm* — Wood Herron & Evans LLP

(57) ABSTRACT

An electrostatic chuck includes an internal electrode and a resin layer that embeds a periphery of the internal electrode. The resin layer contains a thermo-conductive filler.

24 Claims, 6 Drawing Sheets

(56) References Cited

U.S. PATENT DOCUMENTS

| | | | | |
|---|---|---|---|---|
| 2003/0123213 | A1* | 7/2003 | Kosakai | H02N 13/00 361/234 |
| 2005/0215073 | A1* | 9/2005 | Nakamura | H10P 72/0432 438/778 |
| 2008/0212255 | A1* | 9/2008 | Miyaji | H10P 72/72 361/234 |
| 2014/0376148 | A1* | 12/2014 | Sasaki | B23Q 3/15 361/234 |
| 2017/0278738 | A1* | 9/2017 | Ito | H02N 13/00 |
| 2019/0019654 | A1* | 1/2019 | Kobayashi | C23C 16/45565 |
| 2022/0157636 | A1* | 5/2022 | Takemoto | H10P 72/722 |

FOREIGN PATENT DOCUMENTS

| | | | |
|---|---|---|---|
| JP | 2005277074 | A | 10/2005 |
| JP | 2016086081 | A | 5/2016 |
| JP | 2018117024 | A | 7/2018 |
| JP | 2020107881 | A | 7/2020 |
| JP | 2020178077 | A | 10/2020 |
| JP | 2021057549 | A | 4/2021 |
| TW | 201721789 | A | 6/2017 |
| WO | 2020/138179 | A1 | 7/2020 |

OTHER PUBLICATIONS

PCT Office, International Search Report issued in PCT/JP2023/013583 dated Jun. 20, 2023.

* cited by examiner

ELECTROSTATIC CHUCK

TECHNICAL FIELD

The present invention relates to an electrostatic chuck.

Priority is claimed on Japanese Patent Application No. 2022-058351, filed Mar. 31, 2022 and Japanese Patent Application No. 2022-058354, filed Mar. 31, 2022, the content of which is incorporated herein by reference.

BACKGROUND ART

When processes such as processing a substrate and forming a film on a substrate are performed using a substrate such as a semiconductor wafer, a glass substrate, or an insulating substrate, it is necessary to maintain the substrate at a predetermined position. Conventionally, mechanical chuck devices using a mechanical method, vacuum chuck devices using vacuum suction, and the like have been used, and electrostatic chuck devices using electrostatic attraction have been used in recent years. An electrostatic chuck device includes an internal electrode coated with a dielectric layer. When a voltage is applied to the internal electrode to cause a potential difference between a substrate and an electrode, an electrostatic attraction force is generated in the dielectric layer. Accordingly, the substrate is supported substantially parallel with the internal electrode.

Patent Document 1 proposes that an electrostatic chuck device having an insulating organic film provided on both sides of an internal electrode in a thickness direction and having a ceramic layer stacked thereon with an intermediate layer interposed therebetween. In such an electrostatic chuck device, an adhesive layer is provided between the internal electrode and an insulating organic film. Patent Document 1 discloses that, in comparison with a conventional electrostatic chuck device including a dielectric layer formed by thermally spraying a ceramic on an internal electrode, the ceramic layer has plasma resistance but the thickness of the dielectric layer increases, and thus it is difficult to achieve a large attraction force.

CITATION LIST

Patent Document

Patent Document 1: PCT International Publication No. WO 2020/138179

SUMMARY OF INVENTION

Problem to be Solved by the Invention

As described in Patent Document 1, when the internal electrode is surrounded by a resin such as an adhesive or a film, the ambient temperature of the internal electrode rises and there is a concern that a decrease in voltage resistance and peeling of an electrode, and thus operation conditions may be constrained.

An objective of the invention is to provide an electrostatic chuck with excellent heat dissipation.

Means to Solve the Problem

An electrostatic chuck according to a first aspect of the invention includes an internal electrode and a resin layer that embeds a periphery of the internal electrode, and the resin layer contains a thermo-conductive filler.

A second aspect of the invention provides the electrostatic chuck according to the first aspect, wherein the resin layer is stacked directly on a base.

A third aspect of the invention provides the electrostatic chuck according to the first or second aspect, wherein a mixing proportion of the thermo-conductive filler in the resin layer ranges from 30 vol % to 80 vol %.

A fourth aspect of the invention provides the electrostatic chuck according to the first or second aspect, wherein a thickness of the resin layer ranges from 50 μm to 300 μm.

A fifth aspect of the invention provides the electrostatic chuck according to the first or second aspect, wherein the resin layer is stacked along with a ceramic layer with an adhesive layer interposed therebetween.

A sixth aspect of the invention provides the electrostatic chuck according to the first or second aspect, wherein a polyimide film is adhesively attached on a surface of the resin layer.

A seventh aspect of the invention provides the electrostatic chuck according to the first or second aspect, wherein the resin layer contains a thermo-conductive filler formed of at least one type selected from a group consisting of alumina, yttria, silicon carbide, boron nitride, and aluminum nitride, some particles of the thermo-conductive filler have a particle diameter of 20 μm to 50 μm, and the other particles have a smaller particle diameter than the particle diameter.

An eighth aspect of the invention provides the electrostatic chuck according to the first or second aspect, wherein a three-dimensional particle unevenness of the thermo-conductive filler ranges from 1.00 to 2.50.

A ninth aspect of the invention provides the electrostatic chuck according to the first or second aspect, wherein the thermo-conductive filler includes a first filler, a second filler, and a third filler, a volume-based mean particle diameter of the first filler is greater than or equal to 10 μm and less than or equal to ⅓ of the thickness of the resin layer, a volume-based mean particle diameter of the second filler is greater than or equal to 2 μm and less than or equal to 9 μm, and a volume-based mean particle diameter of the third filler is less than or equal to 0.9 μm.

A tenth aspect of the invention provides the electrostatic chuck according to the ninth aspect, wherein, when a ratio of a volume of the first filler to a total volume of the first filler, the second filler, and the third filler is defined as L, a ratio of a volume of the second filler to the total volume of the first filler, the second filler, and the third filler is defined as M, and a ratio of a volume of the third filler to the total volume of the first filler, the second filler, and the third filler is defined as S, L:M:S ranges from 100:90:20 to 100:5:1.

An electrostatic chuck device according to another aspect of the invention is an electrostatic chuck device for attracting a substrate and includes an electrostatic chuck part that attracts a substrate, a focus ring disposed around the electrostatic chuck part and surrounding an area to which the substrate is to be attracted, and an attraction part disposed around the electrostatic chuck part and attracting the focus ring, and the attraction part includes an electrode that adjusts an electric field near a surface of the focus ring.

In the electrostatic chuck device according to another aspect of the invention, the attraction part includes a dielectric layer formed of thermally sprayed alumina.

In the electrostatic chuck device according to another aspect of the invention, the attraction part includes a resin layer that embeds a periphery of the electrode.

In the electrostatic chuck device according to another aspect of the invention, the resin layer contains a thermo-conductive filler.

In the electrostatic chuck device according to another aspect of the invention, the resin layer is stacked directly along with a base.

In the electrostatic chuck device according to another aspect of the invention, the resin layer contains a thermo-conductive filler at a mixing proportion of 30 vol % to 80 vol %.

In the electrostatic chuck device according to another aspect of the invention, a thickness of the resin layer ranges from 50 μm to 300 μm.

In the electrostatic chuck device according to another aspect of the invention, the resin layer is stacked along with a ceramic layer with an adhesive layer interposed therebetween.

In the electrostatic chuck device according to another aspect of the invention, a polyimide film is adhesively attached on a surface of the resin layer.

In the electrostatic chuck device according to another aspect of the invention, the resin layer contains a thermo-conductive filler formed of at least one type selected from a group consisting of alumina, yttria, silicon carbide, boron nitride, and aluminum nitride, some particles of the thermo-conductive filler have a particle diameter of 20 μm to 50 μm, and the other particles have a smaller particle diameter than the particle diameter.

Effects of the Invention

According to the invention, it is possible to provide an electrostatic chuck with excellent heat dissipation.

According to the invention, it is possible to provide an electrostatic chuck device that can achieve both excellent adhesion and extension in lifetime of a focus ring.

DESCRIPTION OF EMBODIMENTS

Figure 1:
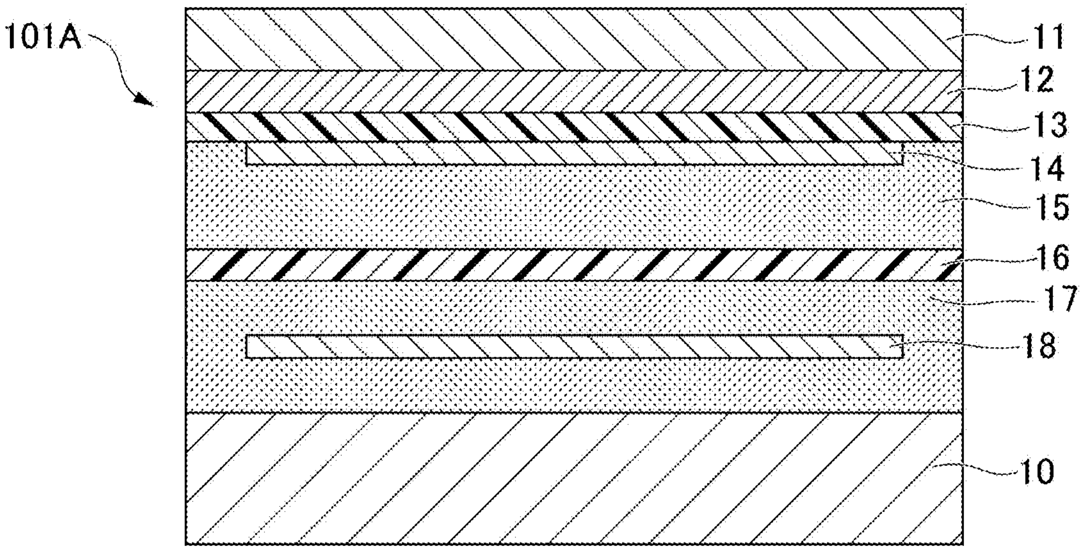
FIG. 1 A cross-sectional view showing an electrostatic chuck according to a first embodiment.

Hereinafter, the invention will be described with reference to exemplary embodiments. In the drawings, dimensional ratios or the like of elements are not limited to the same actual ones.

First Embodiment

FIG. 1 is a cross-sectional view schematically showing an electrostatic chuck 101A according to an embodiment. The electrostatic chuck 101A can be applied to, for example, an electrostatic chuck device. An electrostatic chuck device is, for example, a device that attracts an attraction body (not shown in the drawings) such as a substrate or a focus ring.

A material of the attraction body is not particularly limited as long as electrostatic attraction is possible, and examples thereof include semiconductors such as silicon, glass, ceramics, and an insulating material. The attraction body may be a semiconductor wafer.

The electrostatic chuck 101A includes a first internal electrode 14 and a second internal electrode 18. At least one of the internal electrodes 14 and 18 is an attraction electrode used to attract an attraction body. One of the internal electrodes 14 and 18 may be a control electrode or the like. The number of internal electrodes 14 and 18 is not particularly limited as long as at least one thereof is included in the electrostatic chuck 101A.

Although not particularly shown in the drawings, a power supply part that supplies electric power to the internal electrodes 14 and 18 is provided in a base 10 of the electrostatic chuck 101A. The base 10 can be formed of, for example, ceramics such as silicon carbide (SiC), a metal such as aluminum, or an alloy such as stainless steel.

The internal electrodes 14 and 18 are formed of sheet-shaped conductors. Such a sheet-shaped conductor is not particularly limited, and, for example, a thin film formed of one type or two or more types of metals of copper, aluminum, gold, silver, platinum, chromium, nickel, and tungsten can be suitably used. Examples of such a metallic thin film include a thin film formed by vapor deposition, plating, sputtering, or the like, a thin film formed by applying and drying a conductive paste, and a thin film formed of a metal foil such as a copper foil.

The electrostatic chuck 101A includes resin films 13 and 16 on the side on the attraction body and on the side on the base 10 of the first internal electrode 14, respectively. The resin films 13 and 16 are insulating organic films. A material, a thickness, and the like of the resin film 13 and a material, a thickness, and the like of the resin film 16 may be the same or may be different in some parts.

The material of the resin films 13 and 16 is not particularly limited as long as it has electrical insulation, and examples thereof include polyesters such as polyethylene terephthalate, polyolefins such as polyethylene, cellulose-based resins such as polyimide, polyamide, polyamideimide, polyether sulfone, polyphenylene sulfide, polyether ketone, polyether imide, or triacetyl cellulose, silicone rubber, and fluorine-based resins such as polytetrafluoroethylene.

A resin layer 15 is provided between the resin films 13 and 16 in the thickness direction of the electrostatic chuck 101A. A resin layer 17 is provided between the resin film 16 on the side on the base 10 and the base 10. The resin layers 15 and 17 are, for example, adhesive layers. A material, a thickness, and the like of the resin layer 15 and a material, a thickness, and the like of the resin layer 17 may be the same or may be different in some parts.

The resin of the resin layers 15 and 17 is not particularly limited as long as it has electrical insulation, and examples thereof include an epoxy resin, a phenol resin, a styrene-based block copolymer, a polyamide resin, an acrylonitrile-butadiene copolymer, a polyester resin, a polyimide resin, a silicone resin, an amine compound, and a bismaleimide compound. One type of these resins may be used alone, or two or more types thereof may be mixed and used.

The resin layer 17 embeds the periphery of the periphery of the second internal electrode 18. When it is mentioned that an embedding material embeds an embedding object, it means that the embedding material contacts and covers both surfaces in the thickness direction of the embedding object and end surfaces crossing the thickness direction. For example, the resin material of the resin layer 17 is an embedding material, and the internal electrode 18 is an embedding object. Accordingly, it is possible to decrease the thickness of the resin layer 17 and to improve capacitance.

The thickness of the resin layer 17 covering the bottom side of the internal electrode 18 (the side on the base 10) may be equal to or different from the thickness of the resin layer 17 covering the top side of the internal electrode 18. For example, when a high frequency is applied to the internal electrode 18, the thickness of the resin layer 17 on the side on the base 10 may be increased to avoid interference of the high frequency with the base 10.

Out of the resin layers 15 and 17, at least the resin layer 17 embedding the periphery of the internal electrode 18 contains a thermo-conductive filler. Since the resin layer 17 containing a thermo-conductive filler embeds the periphery of the internal electrode 18, it is possible to further dissipate heat from the internal electrode 18. Since the internal electrode 18 is unified into the resin layer, peeling or the like does not occur, and voltage resistance is excellent.

The resin layer 15 in contact with the internal electrode 14 stacked on the resin film 13 may contain a thermo-conductive filler. Accordingly, it is possible to transmit heat on the surface side of the electrostatic chuck 101A to the base 10 and to decrease the surface temperature of the electrostatic chuck 101A.

The thermo-conductive filler used for the resin layers 15 and 17 is not particularly limited as long as it is a material having more excellent thermal conductivity than the resin of the resin layers 15 and 17, and an inorganic material such as metal oxide, metal nitride, or metal carbide can be preferably used. Specific examples of the thermo-conductive filler include alumina, yttria, silicon carbide, boron nitride, and aluminum nitride. One type of these thermo-conductive fillers may be used alone, or two or more types thereof may be mixed and used.

The mixing proportion of the thermo-conductive filler in the resin layers 15 and 17 preferably ranges from 30 vol % to 80 vol % and more preferably ranges from 50 vol % to 70 vol. When the mixing proportion of thermo-conductive filler is greater than or equal to the lower-limit value, thermal conductivity of the resin layers 15 and 17 can be sufficiently enhanced. When the mixing proportion of the thermo-conductive filler is less than or equal to the upper-limit value, gaps between particles of the thermo-conductive filler can be filled with a resin and thus coupling strength between the particles can be enhanced.

The mixing proportion of the thermo-conductive filler in the resin layers 15 and 17 can be calculated by analyzing a cross-sectional view of a scanning electron microscope (SEM) image showing the resin layers 15 and 17.

Thicknesses of the resin layers 15 and 17 preferably range from 50 μm to 300 μm. When the thicknesses of the resin layers 15 and 17 are greater than or equal to the lower-limit value, voltage resistance to a potential difference can be enhanced. When the thicknesses of the resin layers 15 and 17 are less than or equal to the upper-limit value, it is possible to contribute to capacitance, to enhance attraction, and to further improve thermal conductivity.

On the other hand, an electrostatic chuck using a ceramic for a conventional dielectric layer is likely to increase in thickness of the dielectric layer when a sintered plate is used. Accordingly, even if thermal conductivity of ceramics is higher than that of the resin, heat dissipation becomes less and capacitance becomes lower.

It is preferable that the resin layers 15 and 17 include thermo-conductive fillers with different particle diameters, some particles have a particle diameter in a range of 20 μm to 50 μm, and the other particles have a smaller particle diameter than the particle diameter. Accordingly, even when the thicknesses of the resin layers 15 and 17 are small, the thermo-conductive fillers can be dispersed well in the resin layers 15 and 17. When two or more types of thermo-conductive fillers are included, the thermo-conductive fillers have only to be different in one of material, particle diameter, and shape of the thermo-conductive fillers. When one type of thermo-conductive filler has two or more types of particle diameters, a particle diameter distribution may have two or more peaks.

It is preferable that the particle diameter of the thermo-conductive filler be smaller than the thicknesses of the resin layers 15 and 17. By using large particles and small particles together as the thermo-conductive filler, the small particles can enter gaps between the large particles and thus the mixing proportion of the thermo-conductive filler can be enhanced. For example, the particle diameter of the small particles ranges from 1 μm to 10 μm or from 0.05 μm to 1 μm.

A specific method of enhancing the mixing proportion of the thermo-conductive filler will be described below.

First, thermo-conductive filler having three types of particle diameters of a large size, a middle size, and a small size are prepared. The thermo-conductive filler having a particle diameter of a large size is an example of a first filler. The thermo-conductive filler having a particle diameter of a middle size is an example of a second filler. The thermo-conductive filler having a particle diameter of a small size is an example of a third filler.

In other words, the particle diameter of the first filer is larger than the particle diameter of the second filler and the particle diameter of the third filler. The particle diameter of the second filler is smaller than the particle diameter of the first filler and larger than the particle diameter of the third filler. The particle diameter of the third filler is smaller than the particle diameter of the first filler and the particle diameter of the second filler.

Here, particle diameters are volume-based mean particle diameters.

It is possible to enhance the mixing proportion by combing and using the three types of thermo-conductive fillers. For example, the thermo-conductive filler with a large size contributes to thermal conductivity. Accordingly, by combining the thermo-conductive filler with a large size and the thermo-conductive filler with a middle size, it is possible to enhance the mixing proportion of the thermo-conductive fillers. The thermo-conductive filler with a small size increases viscosity of the resin in the process of manufacturing the resin layer. Accordingly, by mixing the thermo-conductive filler with a small size into the thermo-conductive fillers with a large size and a middle size, it is possible to suppress precipitation of the thermo-conductive fillers with a large size and a middle size and to uniformly disperse the thermo-conductive fillers.

An example of the sizes of three types of thermo-conductive fillers will be described below.

The volume-based mean particle diameter (Dv50) of the thermo-conductive filler with a large size is, for example, greater than or equal to 10 μm and less than or equal to ⅓ of the thickness of the resin layer. For example, the volume-based mean particle diameter of the thermo-conductive filler with a middle size is greater than or equal to 2 μm and less than or equal to 9 μm. The volume-based mean particle diameter of the thermo-conductive filler with a small size is, for example, less than or equal to 0.9 μm. The lower limit of the volume-based mean particle diameter of the thermo-conductive filler with a small size is not particularly limited and is, for example, greater than or equal to 0.1 nm.

Figure 9:
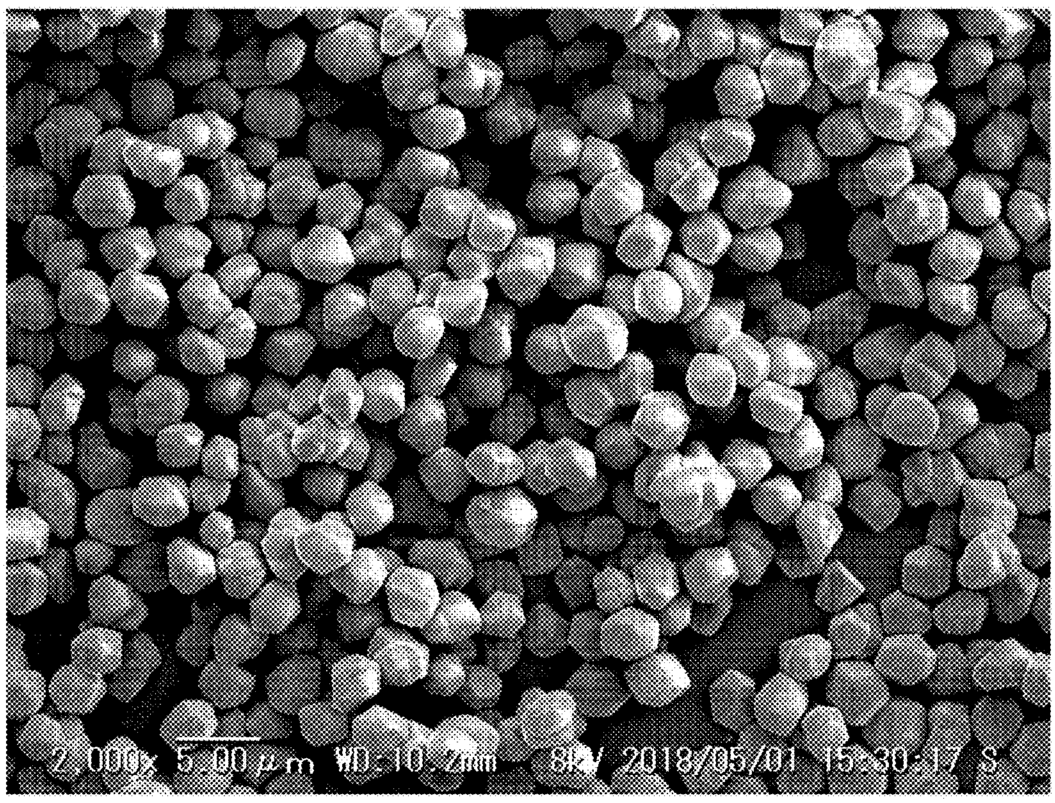
FIG. 9 A diagram showing a SEM image obtained by image-capturing a thermo-conductive filler with a middle size of which a three-dimensional mean particle unevenness is 1.3 from above.

FIG. 9 is a diagram showing a SEM image representing a thermo-conductive filler with a middle size. In FIG. 9, an average three-dimensional particle unevenness of the thermo-conductive filler with a middle size is 1.3.

Figure 10:
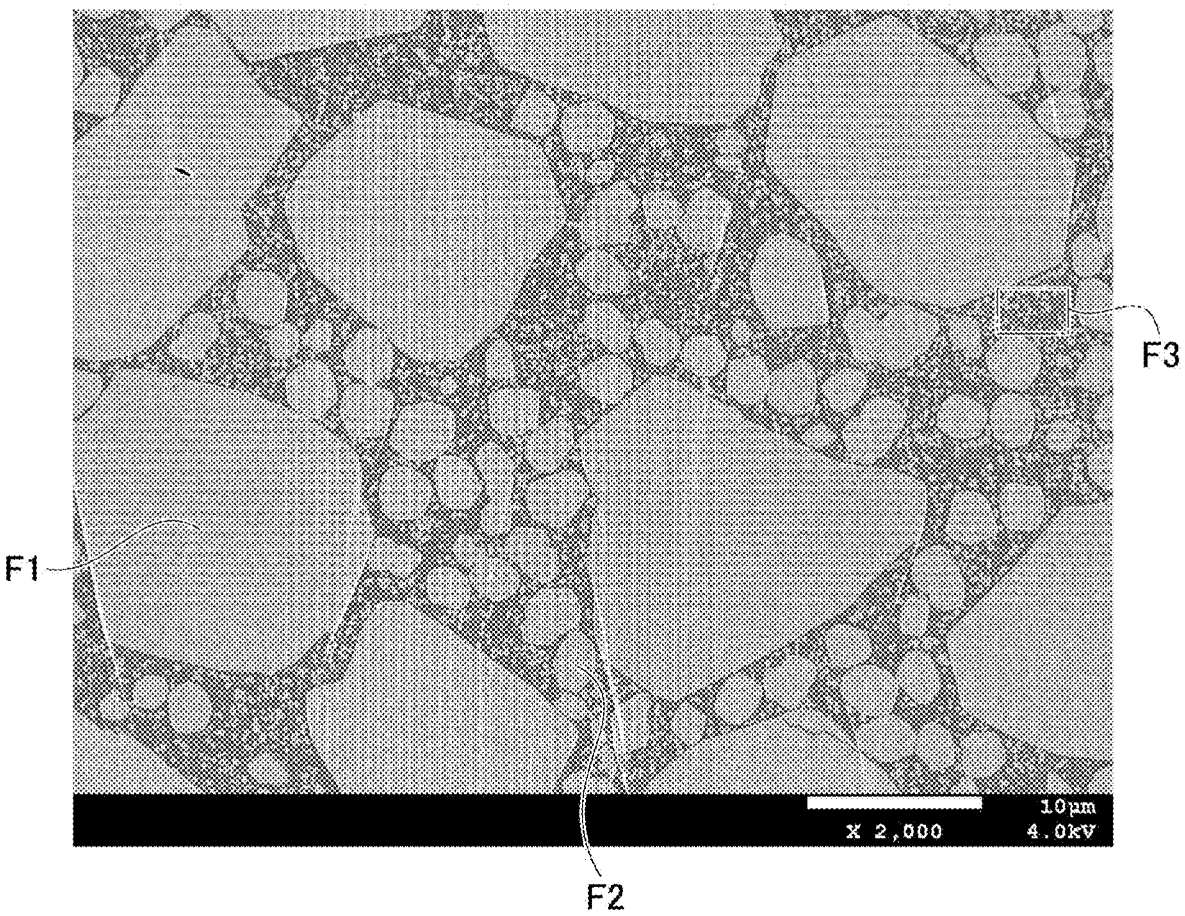
FIG. 10 A SEM image showing a thermo-conductive filler included in a resin layer 15 according to Example 1 and showing a dispersed state of particles with large, middle, and small sizes.

These three types of thermo-conductive fillers are shown, for example, in FIG. 10.

FIG. 10 is a SEM image obtained by image-capturing a cross-section of the resin layer 15 and is a cross-sectional view. The magnification power of the SEM image is 2000.

In FIG. 10, reference sign F1 is a first filler. The first filler F1 is a thermo-conductive filler including relatively large particles. Reference sign F3 is a third filler. The third filler F3 is a thermo-conductive filler including relatively small particles. Reference sign F2 is a second filler. The second filler F2 is a thermo-conductive filler including particles with a middle size smaller than the first filler and larger than the third filler.

Proportions of the three types of thermo-conductive fillers will be described below.

Here, a ratio of a volume of a thermo-conductive filler (with a large size) greater than or equal to 10 μm and less than or equal to ⅓ of the thickness of the resin layer to the total volume of the three types of thermo-conductive fillers is defined as L. A ratio of a volume of a thermo-conductive filler (with a middle size) greater than or equal to 2 μm and less than or equal to 9 μm to the total volume of the three types of thermo-conductive fillers is defined as M. A ratio of a volume of a thermo-conductive filler (with a small size) less than or equal to 0.9 μm to the total volume of the three types of thermo-conductive fillers is defined as S. In this case, it is preferable that L:M:S range from 100:90:20 to 100:5:1. By setting the volume proportions of the three types of thermo-conductive fillers to this range, it is possible to achieve high thermal conductivity.

The average three-dimensional particle unevenness of the thermo-conductive filler will be described below.

The average three-dimensional particle unevenness preferably ranges from 1.00 to 2.50, more preferably ranges from 1.05 to 2.15, and still more preferably ranges from 1.10 to 1.80 or less. By setting the average three-dimensional particle unevenness to this range, uneven shapes of the thermo-conductive fillers decrease and a contact area between the thermo-conductive fillers increases. Accordingly, it is possible to enhance thermal conductivity. Particularly, it is preferable that the average three-dimensional particle unevenness of the thermo-conductive filler with a large size be in the aforementioned range. This is because the thermo-conductive filler with a large size most contributes to thermal conductivity.

The resin layer 17 embedding the periphery of the internal electrode 18 is preferably directly stacked along with the base 10. Since the resin layer 17 has both a voltage resistance function and an adhesion function, the resin layer 17 can be directly stacked along with the base 10. This direct stacking is advantageous in thermal conductivity to the base 10 via the resin layers 15 and 17 including the thermo-conductive fillers. Since the resin layer 17 is also used as an adhesive layer, it is possible to contribute to a decrease in thickness of the electrostatic chuck 101A and to increase capacitance.

It is preferable that the resin films 13 and 16 such as a polyimide film be adhesively attached on the top layer of the resin layers 15 and 17. The top layer is a layer farthest from the base 10. When the resin layers 15 and 17 are formed on the resin films 13 and 16 by application, the resin films 13 and 16 can be used as an application substrate. When the resin layers 15 and 17 are first formed and then the resin films 13 and 16 are stacked thereon, surface undulation of the resin layers 15 and 17 can be more uniform by adhesively attaching the resin films 13 and 16 thereon.

The resin films 13 and 16 and the resin layers 15 and 17 of the electrostatic chuck 101A may be formed as a unified stacked sheet along with the internal electrodes 14 and 18. In this case, the resin layer 17 on the side on the base 10 preferably has an adhesion function to the base 10. A ceramic layer 11 may be formed thereon with the adhesive layer 12 interposed therebetween after the stacked sheet is bonded on the base 10.

A ceramic layer 11 is stacked on the top surface of the resin film 13 on the side on the attraction body with an adhesive layer 12 interposed therebetween. The top surface is a surface farthest from the base 10. It is preferable that the adhesive layer 12 include an insulating resin and a filler. The ceramic layer 11 is a layer in contact with the attraction body.

The insulating resin (a polymer material) used for the adhesive layer 12 may be an organic insulating resin or may be an inorganic insulating resin. The organic insulating resin is not particularly limited, and examples thereof include a polyimide-based resin, an epoxy-based resin, and an acrylic resin. The inorganic insulating resin is not particularly limited, and examples thereof include a silane-based resin and a silicone-based resin.

It is preferable that the adhesive layer 12 include polysilazane. Examples of polysilazane include materials known in the art. Polysilazane may be organic polysilazane or may be inorganic polysilazane. One type of these polysilazane materials may be used alone, or two or more types thereof may be mixed and used.

The filler used for the adhesive layer 12 may be a powder-like inorganic filler or may be a fiber-like filler. The inorganic filler is not particularly limited, and one type or two or more types selected from metal oxides such as alumina, silica, and yttria can be preferably used.

The inorganic filler may employ one of spherical powder and amorphous powder or may employ both thereof. The spherical powder is a spheroid in which powder particles have rounded corners. The amorphous powder is particles not having a constant shape such as a granular shape, a sheet shape, a scale shape, or a needle shape. The mean particle diameter of the inorganic filler preferably ranges from 1 μm to 20 μm. When the inorganic filer is spherical powder, a diameter (outer diameter) thereof is used as a particle diameter; when the inorganic filler is amorphous powder, a largest length is used as a particle diameter.

The fiber-like filler preferably includes, for example, at least one type or two or more types selected from a plant fiber, an inorganic fiber, and an organic fiber. Pulp can be used as the plant fiber. Fiber formed of alumina or the like can be used as the inorganic fiber. A material obtained by fiberizing an organic resin such as an aramid resin or polytetrafluoroethylene can be used as the organic resin.

A content of the inorganic filler in the adhesive layer 12 preferably ranges from 100 mass % to 300 mass % with respect to 100 mass % of the insulating resin and more preferably ranges from 150 mass % to 250 mass %. Accordingly, since inorganic filler particles can form unevenness on the surface of a resin film which is a cured material of the adhesive layer 12, the ceramic layer 11 can be strongly adhered to the adhesive layer 12.

The adhesive layer 12 is formed to cover the whole outer surface of the resin film 13. The method of forming the adhesive layer 12 is not particularly limited, and examples thereof include a bar coating method, a spin coating method, and a spray coating method.

The material of the ceramic layer 11 is not particularly limited, and examples thereof include boron nitride, aluminum nitride, zirconium oxide, silicon oxide, tin oxide, indium oxide, quartz glass, soda glass, lead glass, borosilicate glass, zirconium nitride, and titanium oxide. One type of these ceramics materials may be used alone, or two or more types thereof may be mixed and used.

It is preferable that the ceramic layer 11 be formed by thermally spraying powder with a mean particle diameter of 1 μm to 25 μm. Accordingly, it is possible to decrease gaps in the ceramic layer 11 and to enhance voltage resistance of the ceramic layer 11. Thermal spray is a method of forming a film by heating and melting a film formation material and then spraying the melted material to a processing object using compressed gas. When the ceramic layer 11 is formed through thermal spraying, the top surface of the adhesive layer 12 is used as the processing object, and powder of a ceramics material is used as the film formation material.

The ceramic layer 11 may include a top layer in contact with an attraction body such as a substrate and a bottom layer in contact with the adhesive layer 12. The top layer of the ceramic layer 11 may have unevenness (not shown in the drawings). It is preferable that a gap be formed between the bottom layer and the rear surface of the attraction body in a region not including the top layer. Since only a part of the top layer is in contact with the attraction body, it is possible to adjust an attraction force with respect to the attraction body.

Other Embodiments

An electrostatic chuck device including the aforementioned electrostatic chuck will be described below.

In the following embodiments, the electrostatic chuck according to the first embodiment is an example of an attraction part. The first internal electrode in the first embodiment is an example of an attraction electrode. The second internal electrode in the first embodiment is an example of a control electrode.

In the following description, the electrostatic chuck may be referred to as an attraction part, the first internal electrode may be referred to as an attraction electrode, and the second internal electrode may be referred to as a control electrode.

In the following embodiments, the same elements as in the first embodiment will be referred to by the same reference signs, and description thereof will be omitted or simplified.

Second Embodiment

Figure 2:
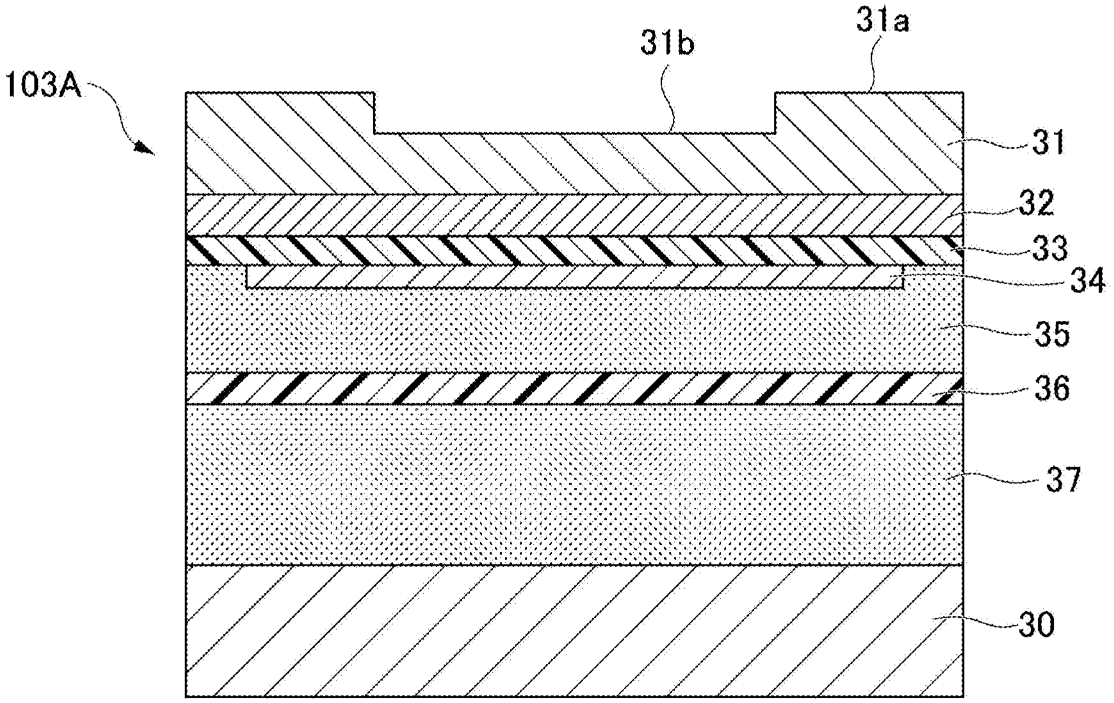
FIG. 2 A cross-sectional view showing an electrostatic chuck part according to a second embodiment.
Figure 3:
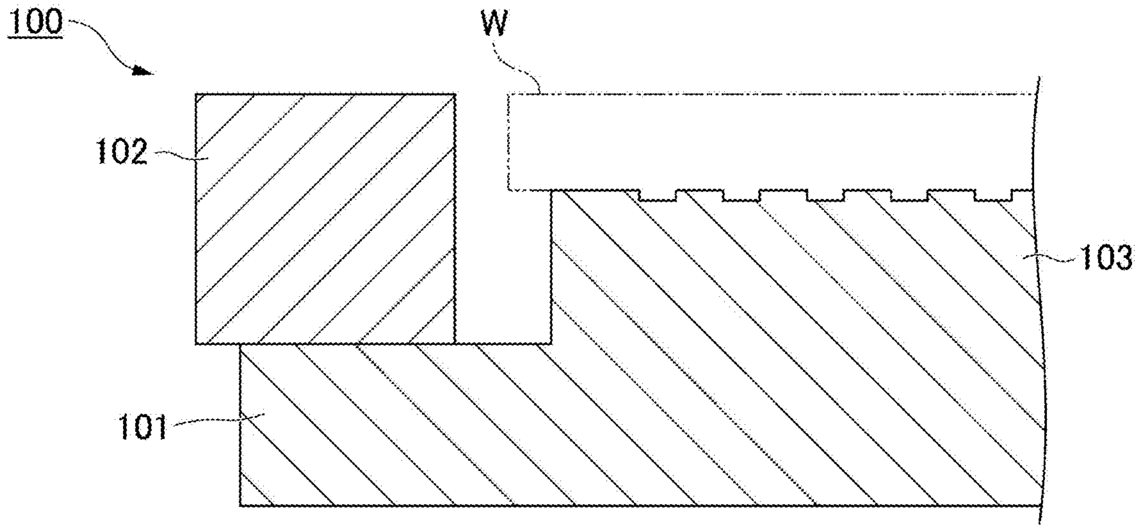
FIG. 3 A cross-sectional view schematically showing an electrostatic chuck device according to the second embodiment.

FIG. 2 shows a cross-sectional structure of an electrostatic chuck part that attracts a substrate. FIG. 3 schematically shows an electrostatic chuck device.

As shown in FIG. 3, an electrostatic chuck device 100 is a device that attracts a substrate W. The electrostatic chuck device 100 includes an electrostatic chuck part 103 that attracts a substrate W, a focus ring 102 that surrounds an area to which the substrate W is attracted, and an attraction part 101 that attracts the focus ring 102. The substrate W is processed using the electrostatic chuck part 103A and then may be shipped as a product. The focus ring 102 can be repeatedly used whenever a substrate W is processed.

The focus ring 102 and the attraction part 101 are disposed around the electrostatic chuck part 103. Planar shapes of the substrate W and the focus ring 102 are, for example, circular, but may be a shape such as a rectangle or a polygonal. When the substrate W is circular, the focus ring 102 is disposed along the circumference of the substrate W.

The materials of the substrate W and the focus ring 102 are not particularly limited as long as electrostatic attraction is possible, and examples thereof include semiconductor such as silicon, glass, ceramics, and insulating materials. The substrate W may be semiconductor wafer.

The attraction part 101A shown in FIG. 1 includes a control electrode 18 that adjusts an electric field near the surface of the focus ring 102 in addition to an attraction electrode 14 for attracting the focus ring 102. For example, a radio frequency (RF) is applied to the control electrode 18. Accordingly, when a plasma process of the substrate W is performed in the electrostatic chuck part 103, it is possible to adjust sheath.

Although not particularly shown in the drawings, a power supply that supplies a radio frequency to the control electrode 18 is provided in the base 10 of the attraction part 101A.

The attraction electrode 14 is formed of a sheet-shaped conductor similarly to the first internal electrode. The control electrode 18 is formed of a sheet-shaped conductor similarly to the second internal electrode.

The attraction part 101A includes the resin films 13 and 16 on the side on the focus ring 102 and the side on the base 10 of the attraction electrode 14, respectively.

In the thickness direction of the attraction part 101A, the resin layer 15 is provided between the resin films 13 and 16. The resin layer 17 is provided between the resin film 16 on the side on the base 10 and the base 10. The resin layers 15 and 17 are, for example, adhesive layers. A material, a thickness, and the like of the resin layer 15 and a material, a thickness, and the like of the resin layer 17 may be the same or may be different in some parts.

The thickness of the resin layer 17 covering the bottom side (the side on the base 10) of the control electrode 18 may be equal to or different from the thickness of the resin layer 17 covering the upper side of the control electrode 18. For example, when a radio frequency is applied to the control electrode 18, the thickness of the resin layer 17 on the side on the base 10 may be increased to avoid interference of the radio frequency with the base 10.

In view of easiness for manufacturing the resin layer 17 to embed the periphery of the control electrode 18, the control electrode 18 is preferably located in a range of ¼ to ¾ of the thickness of the resin layer 17 from the top or the bottom of the resin layer 17 and more preferably in a range of ⅓ to ⅔ of the thickness of the resin layer 17. That is, a ratio of the thickness of the resin layer 17 covering the top of the control electrode 18 and the thickness of the resin layer 17 covering the bottom of the control electrode 18 is preferably in a range of 1:3 to 3:1 and more preferably in a range of 1:2 to 2:1.

Although not particularly shown in the drawings, the attraction electrode 14 may embed the periphery of the resin layer 15. In this case, the attraction electrode 14 may be located in a range of ¼ to ¾ of the thickness of the resin layer 15 from the top or the bottom of the resin layer 15 or in a range of ⅓ to ⅔ of the thickness of the resin layer 15.

Out of the resin layers 15 and 17, the resin layer 17 embedding at least the periphery of the control electrode 18 preferably contains a thermo-conductive filler. Since the resin layer 17 containing a thermo-conductive filler embeds the periphery of the control electrode 18, it is possible to further dissipate heat from the control electrode 18. Since the control electrode 18 is unified into the resin layer, peeling or the like does not occur, and voltage resistance is excellent.

The resin layer 15 in contact with the attraction electrode 14 stacked on the resin film 13 may contain a thermo-conductive filler. Accordingly, it is possible to transmit heat on the surface side of the attraction part 101A to the side on the base 10 and to decrease the surface temperature of the attraction part 101A.

The mixing proportion of the thermo-conductive filler in the resin layer 17 embedding the periphery of the control electrode 18 preferably ranges from 30 vol % to 80 vol % and more preferably ranges from 50 vol % to 70 vol %. When the mixing proportion of thermo-conductive filler is greater than or equal to the lower-limit value, thermal conductivity of the resin layer 17 can be sufficiently enhanced. When the mixing proportion of the thermo-conductive filler is less than or equal to the upper-limit value, gaps between particles of the thermo-conductive filler can be filled with a resin and thus coupling strength between the particles can be enhanced.

The other resin layer 15 included in the attraction part 101A, for example, the resin layer 15 in contact with the attraction electrode 14, may contain the thermo-conductive filler at a mixing proportion of 30 vol % to 80 vol %, and the mixing proportion may range from 50 vol % to 70 vol %.

The mixing proportion of the thermo-conductive filler in the resin layers 15 and 17 can be calculated by analyzing a cross-sectional view of a scanning electron microscope (SEM) image showing the resin layers 15 and 17.

The thickness of the resin layer 17 embedding the periphery of the control electrode 18 preferably ranges from 50 μm to 300 μm. When the thickness of the resin layer 17 is greater than or equal to the lower-limit value, voltage resistance to a potential difference can be enhanced. When the thickness of the resin layer 17 is less than or equal to the upper-limit value, it is possible to contribute to capacitance, to enhance attraction, and to further improve thermal conductivity.

The thickness of the resin layer 15 included in the attraction part 101A, for example, the resin layer 15 in contact with the attraction electrode 14, may be range from 50 μm to 300 μm. The total thickness of the resin layers 15 and 17 included in the attraction part 101A may range from 50 μm to 300 μm.

On the other hand, an electrostatic chuck using ceramic for a conventional dielectric layer is likely to increase in thickness of the dielectric layer when a sintered plate is used. Accordingly, even if thermal conductivity of ceramics is higher than that of the resin, heat dissipation becomes less and capacitance becomes lower.

It is preferable that the resin layers 15 and 17 include two or more types of thermo-conductive fillers with different particle diameters, some particles have a particle diameter in a range of 20 μm to 50 μm, and the other particles have a smaller particle diameter than the particle diameter. Accordingly, even when the thicknesses of the resin layers 15 and 17 are small, the thermo-conductive fillers can be dispersed well in the resin layers 15 and 17. When two or more types of thermo-conductive fillers are included, the thermo-conductive fillers have only to be different in one of material, particle diameter, and shape of the thermo-conductive fillers. When one type of thermo-conductive filler has two or more types of particle diameters, a particle diameter distribution may have two or more peaks.

It is preferable that the particle diameter of the thermo-conductive filler be smaller than the thicknesses of the resin layers 15 and 17. By using large particles and small particles together as the thermo-conductive filler, the small particles can enter gaps between the large particles and thus the mixing proportion of the thermo-conductive filler can be enhanced. For example, the particle diameter of the small particles ranges from 1 μm to 10 μm or from 0.05 μm to 1 μm.

The resin layer 17 embedding the periphery of the control electrode 18 is preferably directly stacked along with the base 10. Since the resin layer 17 has both a voltage resistance function and an adhesion function, the resin layer 17 can be directly stacked along with the base 10. This direct stacking is advantageous in thermal conductivity to the base 10 via the resin layers 15 and 17 including the thermo-conductive fillers. Since the resin layer 17 is also used as an adhesive layer, it is possible to contribute to a decrease in thickness of the attraction part 101A and to increase capacitance.

It is more preferable that the capacitance of the attraction part 101 or 101A attracting the focus ring 102 increase, and the capacitance is preferably greater than or equal to 10 $pF/cm^2$, more preferably greater than or equal to 14 $pF/cm^2$, and still more preferably greater than or equal to 18 $pF/cm^2$. As the capacitance increases, processing with higher efficiency is possible.

It is preferable that the resin films 13 and 16 such as a polyimide film be adhesively attached on the top layers of the resin layers 15 and 17. The top layer is a layer farthest from the base 10. When the resin layers 15 and 17 are formed on the resin films 13 and 16 by application, the resin films 13 and 16 can be used as an application substrate. When the resin layers 15 and 17 are first formed and then the resin films 13 and 16 are stacked thereon, surface undulation of the resin layers 15 and 17 can be more uniform by adhesively attaching the resin films 13 and 16 thereon.

When the electrostatic chuck device 100 including the attraction part 101A is manufactured, the resin films 13 and 16 and the resin layers 15 and 17 of the attraction part 101A may be formed as a unified stacked sheet along with the electrodes 14 and 18. In this case, the resin layer 17 on the side on the base 10 preferably has an adhesion function to the base 10. The stacked sheet is bonded on the base 10 and then a ceramic layer 11 may be formed with the adhesive layer 12 interposed therebetween.

The ceramic layer 11 is stacked on the top surface of the resin film 13 on the side on the focus ring 102 with an adhesive layer 12 interposed therebetween. The top surface is a surface farthest from the base 10. It is preferable that the adhesive layer 12 include an insulating resin and a filler. The ceramic layer 11 is a layer in contact with the focus ring 102.

The electrostatic chuck part 103A shown in FIG. 2 includes an attraction electrode 34 attracting a substrate W. Although not particularly shown in the drawings, the electrostatic chuck part 103A may include a control electrode that adjusts an electric field near the surface of the substrate W.

A base 30 of the electrostatic chuck part 103A may be formed as a unified body with the base 10 of the attraction part 101A. The material or the like of the base 30 may be designed in the same way as the base 10. The attraction electrode 34 of the electrostatic chuck part 103A may be designed in the same way as the attraction electrode 14 of the attraction part 101A. Design can also be appropriately modified depending on whether an attraction body is the focus ring 102 or the substrate W.

The electrostatic chuck part 103A includes resin films 33 and 36 on the side on the substrate W and the side on the base 30 of the attraction electrode 34, respectively. The resin films 33 and 36 of the electrostatic chuck part 103A can be designed in the same way as the resin films 13 and 16 of the attraction part 101A. A material, a thickness, and the like of the resin films 33 and 36 and a material, a thickness, and the like of the resin films 13 and 16 may be the same or may be different in some parts.

In the thickness direction of the electrostatic chuck part 103A, a resin layer 35 is provided between the resin films 33 and 36. A resin layer 37 is provided between the resin film 36 on the side on the base 30 and the base 30. The resin layers 35 and 37 of the electrostatic chuck part 103A may be designed in the same way as the resin layers 15 and 17 of the attraction part 101A. For example, the resin layers 35 and 37 may contain a thermo-conductive filler. A material, a thickness, and the like of the resin films 35 and 37 and a material, a thickness, and the like of the resin layers 15 and 17 may be the same or may be different in some parts.

It is more preferable that the capacitance of the electrostatic chuck part 103 or 103A attracting a substrate W increase, and the capacitance is preferably greater than or equal to 10 $pF/cm^2$, more preferably greater than or equal to 14 $pF/cm^2$, and still more preferably greater than or equal to 18 $pF/cm^2$. As the capacitance increases, processing with higher efficiency is possible.

It is preferable that the resin layers 35 and 37 containing the thermo-conductive filler be directly stacked along with the base 30. Accordingly, it is possible to further enhance thermal conductivity to the base 30 via the resin layers 35 and 37 containing the thermo-conductive filler.

It is preferable that the resin films 33 and 36 such as a polyimide film be adhesively attached on the top layers of the resin layers 35 and 37. The top layer is a layer farthest from the base 30. When the resin layers 35 and 37 are formed on the resin films 33 and 36 by application, the resin films 33 and 36 can be used as an application substrate. When the resin layers 35 and 37 are first formed and then the resin films 33 and 36 are stacked thereon, surface undulation of the resin layers 35 and 37 can be more uniform by adhesively attaching the resin films 33 and 36 thereon.

When the electrostatic chuck device 100 including the electrostatic chuck part 103A is manufactured, the resin films 33 and 36 and the resin layers 35 and 37 may be formed as a unified stacked sheet along with the electrode 34. In this case, the resin layer 37 on the side on the base 30 preferably has an adhesion function to the base 30. A ceramic layer 31 may be formed with the adhesive layer 32 interposed therebetween after the stacked sheet has been bonded on the base 30.

The ceramic layer 31 is stacked on the top surface of the resin film 33 on the side on the substrate W with an adhesive layer 32 interposed therebetween. The top surface is a surface farthest from the base 30. It is preferable that the adhesive layer 32 include an insulating resin and a filler. The adhesive layer 32 of the electrostatic chuck part 103A may be designed in the same way as the adhesive layer 12 of the attraction part 101A. The material or the like of the ceramic layer 31 of the electrostatic chuck part 103A may be designed in the same way as the ceramic layer 11 of the attraction part 101A.

The ceramic layer 31 of the electrostatic chuck part 103A may include a top layer 31*a* in contact with a substrate W and a bottom layer 31*b* in contact with the adhesive layer 32. The top layer 31*a* may have unevenness. It is preferable that a gap be formed between the bottom layer 31*b* and the rear surface of the substrate W in a region not including the top layer 31*a*. Since only a part of the top layer 31*a* is in contact with the substrate W, it is possible to adjust an attraction force with respect to the substrate W.

Third Embodiment

Figure 4:
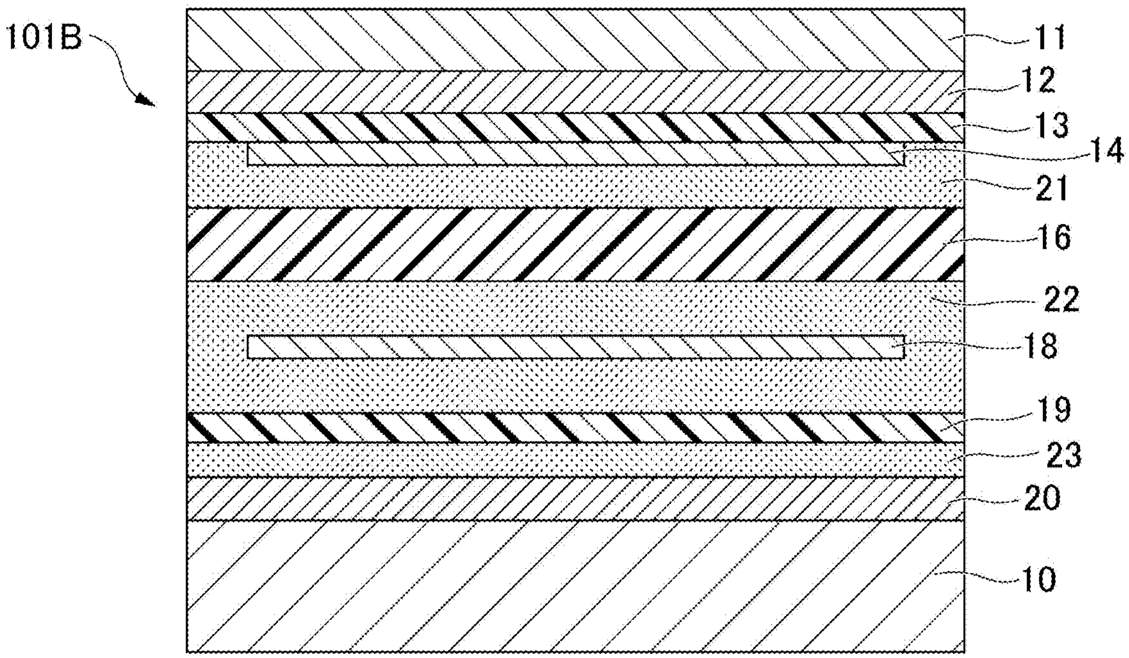
FIG. 4 A cross-sectional view showing an attraction part according to a third embodiment.
Figure 5:
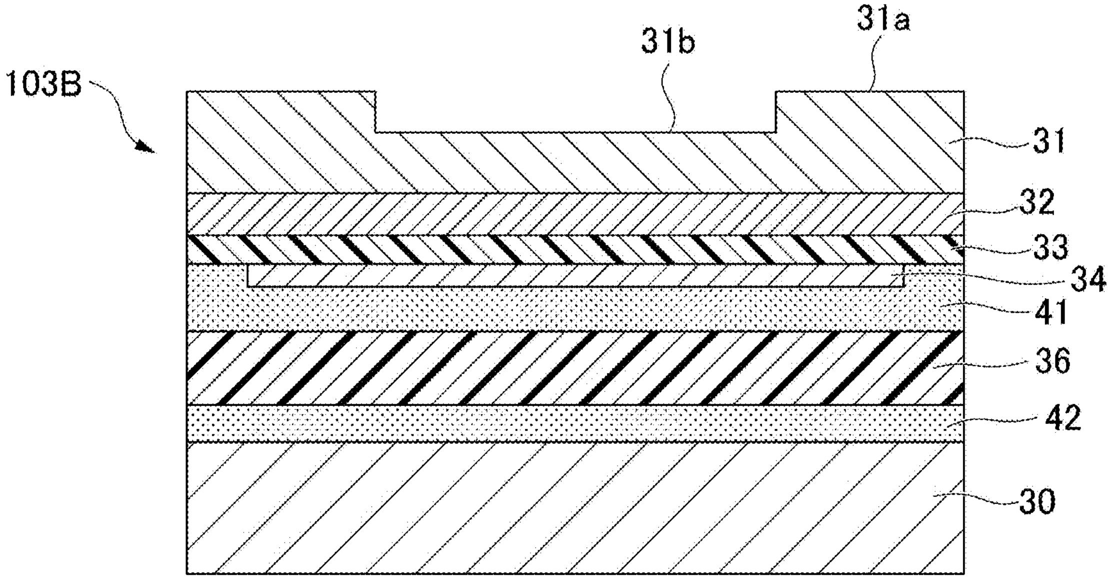
FIG. 5 A cross-sectional view showing an electrostatic chuck part according to the third embodiment.

An electrostatic chuck device according to a third embodiment has the same configuration as the electrostatic chuck device according to the second embodiment, except that a cross-sectional structure of an attraction part 101B shown in FIG. 4 and a cross-sectional structure of an electrostatic chuck part 103B shown in FIG. 5 are modified as follows. The corresponding elements will be referred to by the same reference signs, and description thereof will be omitted.

The attraction part 101B according to the third embodiment includes adhesive layers 21 and 22 instead of the resin layers 15 and 17 containing the thermo-conductive filler, and a resin film 19, an adhesive layer 23, and a dielectric layer 20 are provided in this order between the adhesive layer 22 embedding the periphery of the control electrode 18 and the base 10. Although not particularly shown in the drawings, the resin layers 15 and 17 containing the thermo-conductive filler may also be used instead of the adhesive layers 21 and 22 in the third embodiment.

It is preferable that the dielectric layer 20 be formed of thermally sprayed alumina. The thermally sprayed alumina of the dielectric layer 20 can be formed by thermally spraying alumina to the base 10. By using alumina with high thermal conductivity, it is possible to improve voltage resistance and thermal conductivity between the control electrode 18 and the base 10.

The resin film 19 is stacked on the bottom surface of the adhesive layer 22 embedding the periphery of the control electrode 18. The adhesive layer 23 is applied to the bottom surface of the resin film 19 and has an adhesion function with respect to the dielectric layer 20. Although not particularly shown in the drawings, the resin film may be adhesively attached on the dielectric layer 20 using the adhesive layer 22 embedding the periphery of the control electrode 18.

The material of the resin film 19 is not particularly limited as long as it has electrical insulation, and examples thereof include polyester such as polyethylene terephthalate, polyolefin such as polyethylene, cellulose-based resin such as polyimide, polyamide, polyamideimide, polyether sulfone, polyphenylene sulfide, polyether ketone, polyether imide, or triacetyl cellulose, silicone rubber, and fluorine-based resin such as polytetrafluoroethylene. A material, a thickness, and the like of the resin film 19 and the material, the thickness, and the like of the resin films 13 and 16 may be the same or may be different in some parts.

The adhesive of the adhesive layers 21, 22, and 23 is not particularly limited as long as it has electrical insulation, and examples thereof include an epoxy resin, a phenol resin, a styrene-based block copolymer, a polyamide resin, an acrylonitrile-butadiene copolymer, a polyester resin, a polyimide resin, a silicone resin, an amine compound, and a bismaleimide compound. One type of these adhesives may be used alone, or two or more types thereof may be mixed and used.

When the electrostatic chuck device 100 including the attraction part 101B is manufactured, the resin films 13, 16, and 19 and the adhesive layers 21, 22, and 23 may be formed as a unified stacked sheet along with the electrodes 14 and 18. A ceramic layer 11 may be formed with the adhesive layer 12 interposed therebetween after the stacked sheet has been bonded on the dielectric layer 20 on the side on the base 10 using the adhesive layer 23.

The electrostatic chuck part 103B according to the third embodiment is the same as the electrostatic chuck part 103A according to the second embodiment, except that adhesive layers 41 and 42 are used instead of the resin layers 35 and 37. The adhesive layers 41 and 42 are formed of an adhesive not including an insulating filler. The adhesive layers 41 and 42 may be designed in the same way as the adhesive layers 21, 22, and 23.

Fourth Embodiment

Figure 6:
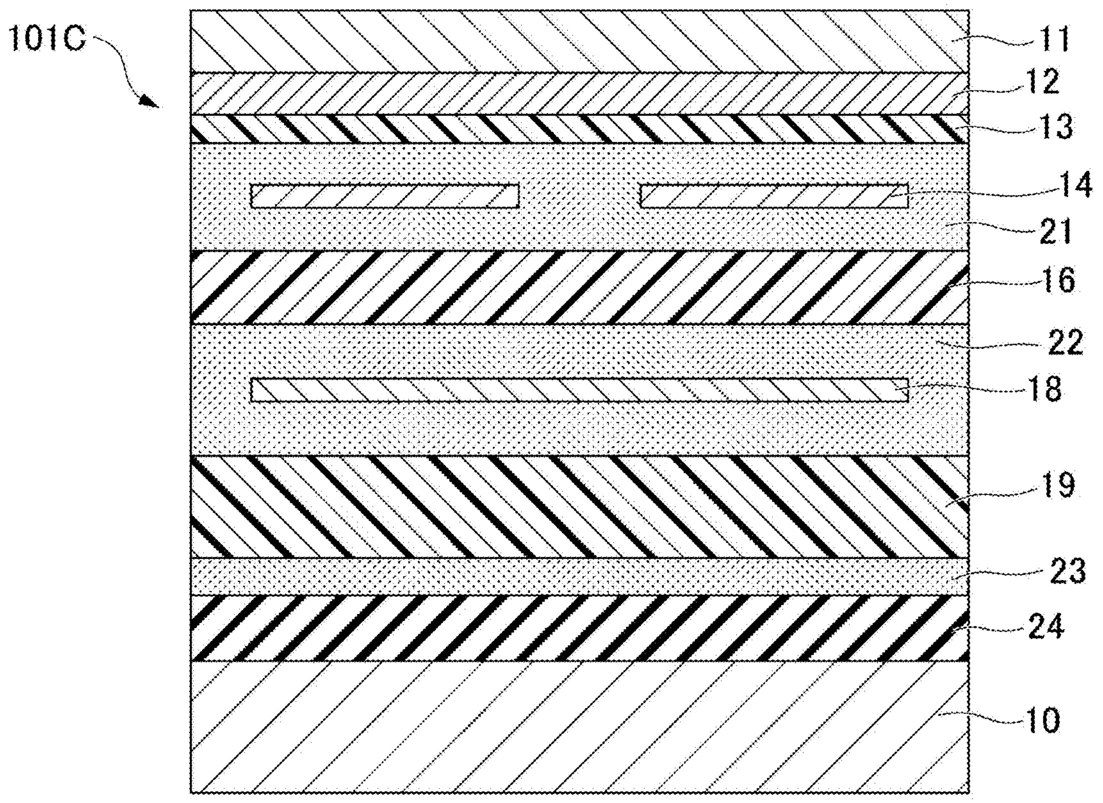
FIG. 6 A cross-sectional view showing an attraction part according to a fourth embodiment.
Figure 7:
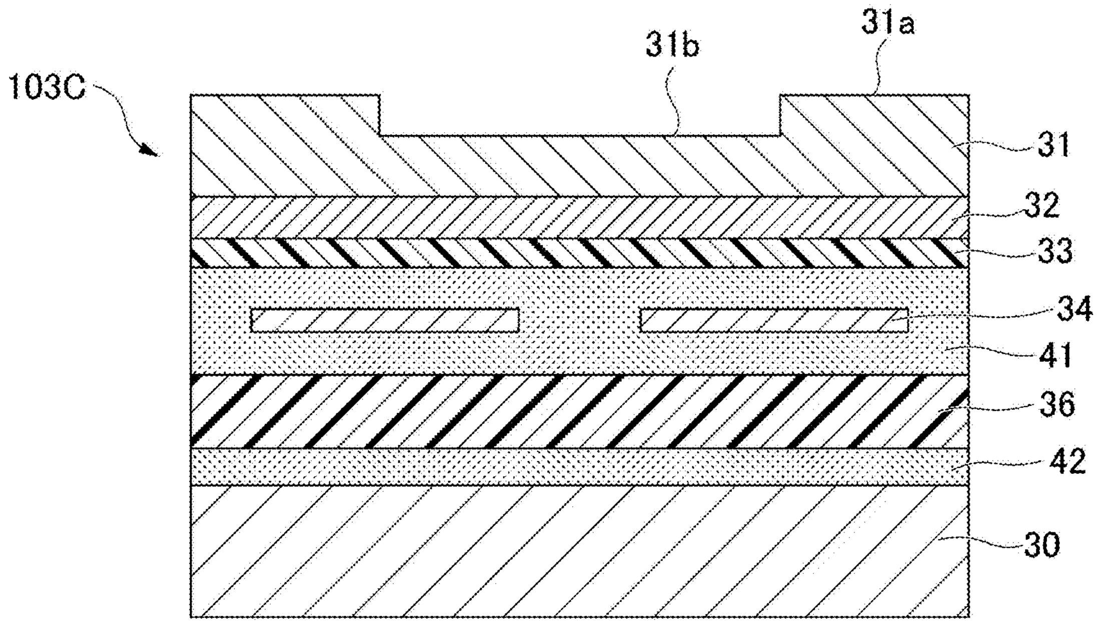
FIG. 7 A cross-sectional view showing an electrostatic chuck part according to the fourth embodiment.

An electrostatic chuck device according to a fourth embodiment has the same configuration as the electrostatic chuck device according to the third embodiment, except that a cross-sectional structure of an attraction part 101C shown in FIG. 6 and a cross-sectional structure of an electrostatic chuck part 103C shown in FIG. 7 are modified as follows. The corresponding elements will be referred to by the same reference signs, and description thereof will be omitted.

The attraction part 101C according to the fourth embodiment includes a coating layer 24 on the base 10 instead of the dielectric layer 20 in the attraction part 101B according to the third embodiment. The coating layer 24 can be formed of a dielectric resin such as polyimide. The coating layer 24 can be formed on the base 10 by being coated with the dielectric resin. Although not particularly shown in the drawings, the resin layers 15 and 17 containing the thermo-conductive filler can be used instead of the adhesive layers 21 and 22 in the fourth embodiment.

Adhesive layers 21 and 41 used for the attraction part 101C and the electrostatic chuck part 103C are formed on both surfaces of the attraction electrodes 14 and 34. Between the resin films 13 and 16 in the attraction part 101C and between the resin films 33 and 36 in the electrostatic chuck part 103C, the attraction electrodes 14 and 34 formed of a sheet-shaped conductor are interposed between the adhesives. Accordingly, the periphery of the attraction electrodes 14 and 34 can be embedded by the adhesive layers 21 and 41.

While the invention has been described with reference to exemplary embodiments, the invention is not limited to the embodiments and can be modified in various forms without departing from the gist of the invention. Examples of modifications can include additions, substitutions, omissions, and other changes of elements in the embodiments. Elements used in two or more embodiments can also be appropriately combined.

EXAMPLES

Hereinafter, the invention will be described in more detail with reference to examples and comparative examples, and the invention is not limited to the following examples.

(Test 1)

(Method of Measuring Surface Temperature of Ceramic Layer)

A flow channel of an electrostatic chuck and a chiller were connected, and cooling was performed using a refrigerant such that the temperature of the base reaches 0° C. Then, a heat source was attached to the top surface of the electrostatic chuck, heating was performed with a heat input 1000 W, and the surface temperature of the electrostatic chuck was measured.

(Method of Measuring Average Three-Dimensional Particle Unevenness)

By repeating observation and slicing of a sample of a thermo-conductive filler in the resin layer every 50 nm using an FIB-SEM device, a 3D slice image shown in FIG. 10 was obtained. Here, an observation range was set to 50 μm×50 μm. The obtained image was subjected to image analysis using three-dimensional quantitative analysis software. An average value of measured values corresponding to 30 particles obtained by image analysis was obtained. An average three-dimensional particle unevenness was obtained based on the average value.

Examples 1 to 17

Examples 1 to 17 correspond to the electrostatic chuck according to the first embodiment.

Figure 8:
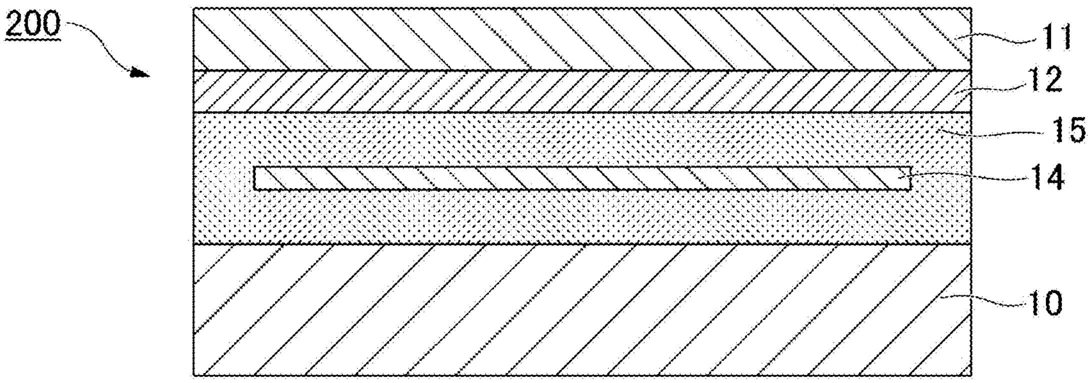
FIG. 8 A cross-sectional view showing an electrostatic chuck according to an example.

FIG. 8 shows electrostatic chucks 200 according to Examples 1 to 17. The procedures of manufacturing the electrostatic chucks 200 are as follows.

First, a polyimide and an epoxy-mixed resin containing a thermo-conductive filler was applied on a PET film by a coater. Here, a weight ratio of the polyimide (P) and the epoxy-mixed resin (E) was P:E=3:7.

Thereafter, an uncured resin layer A was obtained by performing drying under conditions of 100° C. and 10 minutes.

On the other hand, a polyimide and an epoxy-mixed resin containing a thermo-conductive filler was applied on a copper foil by a coater. Here, a weight ratio of the polyimide (P) and the epoxy-mixed resin (E) was P:E=3:7.

Thereafter, an uncured resin layer B was obtained by performing drying under conditions of 100° C. and 10 minutes.

After the resin layer B was cured, etching was performed on the copper foil, and an electrode pattern was formed, whereby an internal electrode 14 was obtained.

The resin layer A and the resin layer B with the internal electrode 14 were stacked on the base 10 of aluminum. A resin layer 15 was formed by performing drying of the stacked body under conditions of 100° C. and 1 hour.

Then, an adhesive layer 12 containing silicon was formed on the resin layer 15 by application, and a ceramic layer 11 of alumina was formed by thermal spraying, whereby electrostatic chucks 200 were obtained.

The mixing proportions of the thermo-conductive fillers (filler mixing proportions) in the resin layer 15 and the thicknesses of the resin layer 15 are shown in Table 1. At the time of use of the electrostatic chucks 200, the measurement results of the surface temperature of the ceramic layer 11 are shown in Table 1.

Comparative Example 1

Comparative Example 1 was the same as Example 1, except that the resin layer 15 did not contain a thermo-conductive filler.

Comparative Example 2

An electrostatic chuck having a structure in which the resin film 16, the resin layer 17, and the internal electrode 18 were omitted from the electrostatic chuck 101A having the structure shown in FIG. 1 and in which the resin layer 15 containing a conductive filler, the internal electrode 14, the resin film 13, the adhesive layer 12, and the ceramic layer 11 were stacked in this order on the base 10 was manufactured. In this case, the internal electrode 14 was formed in contact with the resin film 13.

(Conclusion)

The above results are concluded and shown in Table 1.

TABLE 1

| | Mixing proportion of thermo-conductive filler (vol %) | Filler size Large | Filler size Middle | Filler size Small | Three-dimensional mean particle unevenness of large particles | Thickness of resin layer (μm) | Surface temperature of ceramic layer (° C.) |
|---|---|---|---|---|---|---|---|
| Example 1 | 80 | 100 | 50 | 10 | 1.6 | 70 | 0.6 |
| Example 2 | 30 | 100 | 50 | 10 | 1.6 | 70 | 3.8 |
| Example 3 | 50 | 100 | 50 | 10 | 1.6 | 70 | 2 |
| Example 4 | 10 | 100 | 50 | 10 | 1.6 | 70 | 7.2 |
| Example 5 | 90 | 100 | 50 | 10 | 1.6 | 40 | 0.5 |
| Example 6 | 80 | 100 | 50 | 10 | 1.6 | 300 | 1.3 |
| Example 7 | 80 | 100 | 50 | 10 | 1.6 | 350 | 1.4 |
| Example 8 | 80 | 100 | 90 | 10 | 1.6 | 70 | 1 |
| Example 9 | 80 | 100 | 10 | 10 | 1.6 | 70 | 0.4 |
| Example 10 | 80 | 100 | 50 | 20 | 1.6 | 70 | 0.6 |
| Example 11 | 80 | 100 | 50 | 1 | 1.6 | 70 | 0.6 |
| Example 12 | 80 | 100 | 50 | 10 | 2.2 | 70 | 2.8 |
| Example 13 | 80 | 100 | 50 | 10 | 1.05 | 70 | 1 |
| Example 14 | 80 | 100 | 50 | 10 | 1.6 | 100 | 0.8 |
| Example 15 | 80 | 100 | 50 | 10 | 1.6 | 200 | 1 |
| Example 16 | 80 | 100 | 50 | 10 | 1.6 | 500 | 1.9 |
| Example 17 | 30 | 100 | 50 | 10 | 3 | 70 | 5 |
| Comparative Example 1 | 0 | — | — | — | — | 70 | 10.5 |
| Comparative Example 2 | 80 | 100 | 50 | 10 | 1.6 | 70 | 4.1 |

The following points become apparent from the results shown in Table 1.

(A1) High thermal conductivity can be achieved by setting the mixing proportion of the thermo-conductive filler to be in a range of 30 vol % to 80 vol %.

(A2) Coupling strength between particles can be enhanced by filling gaps between particles of the thermo-conductive filler with a resin.

(A3) Resistance to a potential difference can be enhanced by setting the thickness of the resin layer to greater than or equal to 50 μm.

(A4) Attraction can be enhanced and thermal conductivity can be further improved by setting the thickness of the resin layer to less than or equal to 300 μm.

FIG. 10 shows a SEM image indicating a resin layer according to Example 1. As shown in FIG. 10, it is understood that particles with large, middle, and small sizes are dispersed in the resin layer.

REFERENCE SIGNS LIST

W Substrate
10, 30 Base
11, 31 Ceramic layer
12, 32 Adhesive layer
13, 16, 19, 33, 36 Resin film
14, 34 Attraction electrode (first electrode)
15, 17, 35, 37 Resin layer
18 Control electrode (second electrode)
20 Dielectric layer
21, 22, 23, 41, 42 Adhesive layer
24 Coating layer
31*a* Top layer
31*b* Bottom layer
100 Electrostatic chuck device
101, 101A, 101B, 101C Attraction part (electrostatic chuck)
102 Focus ring
103, 103A, 103B, 103C Electrostatic chuck part

The invention claimed is:

1. An electrostatic chuck comprising:

an internal electrode; and a resin layer that embeds a periphery of the internal electrode, wherein the resin layer contains a thermo-conductive filler formed of at least one type selected from a group consisting of alumina, yttria, silicon carbide, boron nitride, and aluminum nitride, some particles of the thermo-conductive filler have a particle diameter of 20 μm to 50 μm, and the other particles have a smaller particle diameter than the particle diameter.

2. The electrostatic chuck according to claim 1, wherein the resin layer is stacked directly on a base.

3. The electrostatic chuck according to claim 1, wherein a mixing proportion of the thermo-conductive filler in the resin layer ranges from 30 vol % to 80 vol %.

4. The electrostatic chuck according to claim 1, wherein a thickness of the resin layer ranges from 50 μm to 300 μm.

5. The electrostatic chuck according to claim 1, wherein the resin layer is stacked along with a ceramic layer with an adhesive layer interposed therebetween.

6. The electrostatic chuck according to claim 1, wherein a polyimide film is adhesively attached on a surface of the resin layer.

7. The electrostatic chuck according to claim 1, wherein a three-dimensional particle unevenness of the thermo-conductive filler ranges from 1.00 to 2.50.

8. The electrostatic chuck according to claim 1, wherein the thermo-conductive filler includes a first filler, a second filler, and a third filler, a volume-based mean particle diameter of the first filler is greater than or equal to 10 μm and less than or equal to ⅓ of the thickness of the resin layer, a volume-based mean particle diameter of the second filler is greater than or equal to 2 μm and less than or equal to 9 μm, and a volume-based mean particle diameter of the third filler is less than or equal to 0.9 μm.

9. The electrostatic chuck according to claim 8, wherein when a ratio of a volume of the first filler to a total volume of the first filler, the second filler, and the third filler is defined as L, a ratio of a volume of the second filler to the total volume of the first filler, the second filler, and the third filler is defined as M, and a ratio of a volume of the third filler to the total volume of the first filler, the second filler, and the third filler is defined as S, L:M:S ranges from 100:90:20 to 100:5:1.

10. An electrostatic chuck comprising:

an internal electrode; and a resin layer that embeds a periphery of the internal electrode, wherein the resin layer contains a thermo-conductive filler, and a three-dimensional particle unevenness of the thermo-conductive filler ranges from 1.00 to 2.50.

11. The electrostatic chuck according to claim 10, wherein the resin layer is stacked directly on a base.

12. The electrostatic chuck according to claim 10, wherein a mixing proportion of the thermo-conductive filler in the resin layer ranges from 30 vol % to 80 vol %.

13. The electrostatic chuck according to claim 10, wherein a thickness of the resin layer ranges from 50 μm to 300 μm.

14. The electrostatic chuck according to claim 10, wherein the resin layer is stacked along with a ceramic layer with an adhesive layer interposed therebetween.

15. The electrostatic chuck according to claim 10, wherein a polyimide film is adhesively attached on a surface of the resin layer.

16. The electrostatic chuck according to claim 10, wherein the thermo-conductive filler includes a first filler, a second filler, and a third filler, a volume-based mean particle diameter of the first filler is greater than or equal to 10 μm and less than or equal to ⅓ of the thickness of the resin layer, a volume-based mean particle diameter of the second filler is greater than or equal to 2 μm and less than or equal to 9 μm, and a volume-based mean particle diameter of the third filler is less than or equal to 0.9 μm.

17. The electrostatic chuck according to claim 16, wherein when a ratio of a volume of the first filler to a total volume of the first filler, the second filler, and the third filler is defined as L, a ratio of a volume of the second filler to the total volume of the first filler, the second filler, and the third filler is defined as M, and a ratio of a volume of the third filler to the total volume of the first filler, the second filler, and the third filler is defined as S, L:M:S ranges from 100:90:20 to 100:5:1.

18. An electrostatic chuck comprising:

an internal electrode; and a resin layer that embeds a periphery of the internal electrode, wherein the resin layer contains a thermo-conductive filler, and the thermo-conductive filler includes a first filler, a second filler, and a third filler, a volume-based mean particle diameter of the first filler is greater than or equal to 10 μm and less than or equal to ⅓ of the thickness of the resin layer, a volume-based mean particle diameter of the second filler is greater than or equal to 2 μm and less than or equal to 9 μm, and a volume-based mean particle diameter of the third filler is less than or equal to 0.9 μm.

19. The electrostatic chuck according to claim 18, wherein the resin layer is stacked directly on a base.

20. The electrostatic chuck according to claim 18, wherein a mixing proportion of the thermo-conductive filler in the resin layer ranges from 30 vol % to 80 vol %.

21. The electrostatic chuck according to claim 18, wherein a thickness of the resin layer ranges from 50 μm to 300 μm.

22. The electrostatic chuck according to claim 18, wherein the resin layer is stacked along with a ceramic layer with an adhesive layer interposed therebetween.

23. The electrostatic chuck according to claim 18, wherein a polyimide film is adhesively attached on a surface of the resin layer.

24. The electrostatic chuck according to claim 18, wherein when a ratio of a volume of the first filler to a total volume of the first filler, the second filler, and the third filler is defined as L, a ratio of a volume of the second filler to the total volume of the first filler, the second filler, and the third filler is defined as M, and a ratio of a volume of the third filler to the total volume of the first filler, the second filler, and the third filler is defined as S, L:M:S ranges from 100:90:20 to 100:5:1.

* * * * *